United States Patent
Hendrix et al.

(10) Patent No.: US 10,895,347 B2
(45) Date of Patent: Jan. 19, 2021

(54) HEAT TRANSFER TO AMPOULE TRAYS

(71) Applicant: Entegris, Inc., Billerica, MA (US)

(72) Inventors: Bryan C. Hendrix, Danbury, CT (US); Scott L. Battle, Cedar Park, TX (US); John N. Gregg, Marble Falls, TX (US)

(73) Assignee: ENTEGRIS, INC., Billerica, MA (US)

( * ) Notice: Subject to any disclaimer, the term of this patent is extended or adjusted under 35 U.S.C. 154(b) by 124 days.

(21) Appl. No.: 16/162,560

(22) Filed: Oct. 17, 2018

(65) Prior Publication Data
US 2019/0120433 A1    Apr. 25, 2019

Related U.S. Application Data
(60) Provisional application No. 62/574,931, filed on Oct. 20, 2017.

(51) Int. Cl.
| C23C 16/448 | (2006.01) |
| F17C 7/04 | (2006.01) |
| F28D 21/00 | (2006.01) |

(52) U.S. Cl.
CPC ............ *F17C 7/04* (2013.01); *C23C 16/4485* (2013.01); *F28D 21/00* (2013.01); *F28D 2021/0064* (2013.01)

(58) Field of Classification Search
CPC ....... C23C 14/24; C23C 14/243; C23C 14/26; C23C 16/448; C23C 16/4481
See application file for complete search history.

(56) References Cited

U.S. PATENT DOCUMENTS

| 6,921,062 B2* | 7/2005 | Gregg | C23C 16/4481 |
| | | | 261/23.1 |
| 7,828,274 B2* | 11/2010 | Gregg | C23C 16/4483 |
| | | | 261/142 |
| 7,846,256 B2* | 12/2010 | Suzuki | C23C 16/4481 |
| | | | 118/726 |
| 8,758,515 B2 | 6/2014 | Woelk | |
| 9,034,105 B2* | 5/2015 | Chaubey | C23C 16/4481 |
| | | | 118/726 |
| 9,297,071 B2 | 3/2016 | Kanjolia | |
| 2012/0266967 A1* | 10/2012 | Kanjolia | C23C 16/4481 |
| | | | 137/1 |
| 2014/0174955 A1* | 6/2014 | Sasagawa | C23C 16/4481 |
| | | | 206/0.6 |
| 2019/0271079 A1* | 9/2019 | Kusunoki | C23C 16/4408 |

FOREIGN PATENT DOCUMENTS

| JP | 2013028854 A | 2/2013 |
| KR | 101247824 B | 3/2007 |
| KR | 20080046570 A | 5/2008 |

\* cited by examiner

*Primary Examiner* — Gregory A Wilson
(74) *Attorney, Agent, or Firm* — Entegris, Inc.

(57) ABSTRACT

The invention is directed to a vaporizer or ampoule assembly with improved heat transfer between a vaporizer vessel body and at least one support tray located therein. In particular, there is provided a heat transfer enhancing member that is disposed between a vessel body and support tray. In one example of a heat transfer enhancing member or assembly there is included a heat conductive mesh or liner around totally or partially around the support tray that is wedged in between the support tray and the interior diameter or wall of the vessel body. In a related embodiment, the heat transfer enhancing member includes an expandable support tray sidewall to increase physical contact between the support tray and the vessel body interior wall.

11 Claims, 4 Drawing Sheets

--- PRIOR ART --- though the exterior of the vessel body is heated by a heating jacket or an oven.

HEAT TRANSFER TO AMPOULE TRAYS

CROSS-REFERENCE TO RELATED APPLICATIONS

This application claims the benefit under 35 USC 119 of U.S. Provisional Patent Application No. 62/574,931, filed Oct. 20, 2017, the disclosure of which is hereby incorporated herein by reference in its entirety for all purposes.

FIELD OF INVENTION AND BACKGROUND

The present disclosure relates generally to vaporizers useful in volatilizing solid precursors to provide precursor vapor to a precursor vapor-utilizing process system such as a vapor deposition chamber or an ion implanter and more specifically to support tray assemblies located within vaporizer vessels.

In the use of solid-phase precursors to supply precursor vapor for vapor-utilizing applications, a wide variety of vaporizers have been used. Such vaporizers may comprise a vessel and cover defining an enclosed interior volume in which a solid phase precursor may be stored and subsequently subjected to volatilization conditions to effect sublimation or vaporization of the solid phase precursor to produce precursor vapor. For such purpose, the vaporizer vessel or vessel body may be fabricated of a heat-conductive material and heated to cause the volatilization of the precursor on the support tray and/or a heated carrier gas may be flowed through the vessel to create a mass transfer gradient resulting in entrainment of precursor vapor from the solid source precursor material.

As vessel bodies and tray assembly combinations vary in size, depending on the application, the tolerances between them change increasing the difficulty of having a good fit between the support tray and the interior of the vessel body. Hence, as the size of ampoules or vaporizers have increased, the inherent limitations in the manufacturing of the trays that hold the solid precursor and the vaporizer housing (the base) has dictated that the dimensional specifications for both are far more difficult to meet and had to be relaxed in order to avoid difficulty in the assembly of the ampoule. This has resulted in a larger gap between trays holding and supporting the solid source precursor and the interior of the vaporizer housing in current ampoules. This gap can cause an uneven transfer of heat to the trays holding the precursor and a non-uniform consumption of the solid source material. Therefore, there is a need in the semiconductor industry to improve heat transfer between support trays and vessel bodies without substantially increasing the cost of the overall assembly and without increasing energy costs in having to increase the heat applied to the exterior of the vessel body to ensure the support trays are being heated sufficiently to sublimate the precursor material.

SUMMARY

Heat is required for an ampoule or vaporizer to sublimate the solid or liquid or crystalline precursor so it can be delivered to the semiconductor manufacturing process in a gaseous state. Heaters used are typically in the form of a heating jacket or an oven that surrounds the ampoule, hence the need to accurately and consistently apply the correct amount of heat to sublimate the precursor material within the ampoule. Further, new technology applications have increased the amount of solid chemistries being used in wafer manufacturing and have increased the amount of consumption as well as the need to efficiently vaporize as much of the precursor material as possible while maintaining a very uniform temperature profile. Furthermore, the new applications in the industry require higher delivery rates and more complete utilization of the high value precursors. Increased demands on vaporizer performance have identified shortcomings in the current vaporizer designs using traditional vessel body and support tray assemblies. It would be advantageous to improve current precursor vaporization systems that utilize a vaporizer vessel body with supporting trays without substantially increasing material, energy and labor costs to the end user.

In one example embodiment of a vaporizer system with improved heat transfer between a vaporizer vessel body and at least one support tray located therein, there is provided a heat transfer enhancing member that is disposed between a vessel body and support tray. Specifically, one example of a heat transfer enhancing member or assembly includes adding a heat conductive mesh or liner totally or partially around the support tray that is wedged in between the support tray and the interior diameter or wall of the vessel body. In a related embodiment, the heat transfer assembly includes an oil or grease element or paste or an oil/grease element/paste together with a foam material or mesh liner to wick up the oil/grease, the foam material being located between the support tray and the vessel body interior diameter wall, to not only enhance heat transfer between the support tray and the interior diameter of the vessel body but in some cases to serve as a shim or wedge to shift or push the tray against the interior diameter of the vessel body. In related embodiments, the heat transfer enhancing member or assembly is disposed between a support tray sidewall and the vessel body interior wall. The heat transfer between the sidewall of the vaporizer or ampoule and the material support tray is enhanced by "wedging" a conductive material, such as a conductive mesh liner or an oil/grease material, between both surfaces and to close any air gaps. In this way, the physical parts of the vaporizer assembly do not have to be changed to improve heat transfer between the vessel body and the support trays.

In another example embodiment of a vaporizer system with improved heat transfer between a vaporizer vessel body and at least one support tray located therein, there is provided at least one support tray with a modified base or bottom plate and/or tray sidewall that makes the support tray configurable so as to expand radially about the entire base or bottom of the tray or partially expandable on one side of the support tray (or sidewall of the tray) so as to improve physical contact between the tray bottom plate and/or sidewalls of the support tray and the interior diameter (ID) or wall of the vessel body. In this example, the tray bottom plate or sidewall structures are being mechanically altered to expand outwardly or radially to increase physical contact between the tray and the interior wall of the ampoule and thereby improve heat transfer. In yet another related embodiment, the tray could also be larger than the current tray with a compressible sidewall (with optional release) that can be allowed to expand after installation into the base or vessel body.

In a related embodiment, a C-ring is added to an outer diameter (OD) of a support tray to improve compression fit between the tray and the vessel body. In another related embodiment, heat transfer between the vessel body and each support tray is improved by reducing the tray sidewall height or eliminating it altogether. The heat transfer between the support trays and the interior sidewall of the vessel is improved by finding ways to increase the exposure of the interior diameter of the vessel body to the support trays and/or bottom of the support trays by eliminating the sidewall and making the support tray structure configurable.

The novel features of the various embodiments the invention itself, both as to its construction and its method of operation, together with additional advantages thereof, will be best understood from the following description of specific embodiments when read in connection with the accompanying drawings.

DESCRIPTION OF THE PREFERRED EMBODIMENTS

Following are more detailed descriptions of various related concepts related to, and embodiments of, methods and apparatus according to the present disclosure. It should be appreciated that various aspects of the subject matter introduced above and discussed in greater detail below may be implemented in any of numerous ways, as the subject matter is not limited to any particular manner of implementation. Examples of specific implementations and applications are provided primarily for illustrative purposes.

Figure 1A:
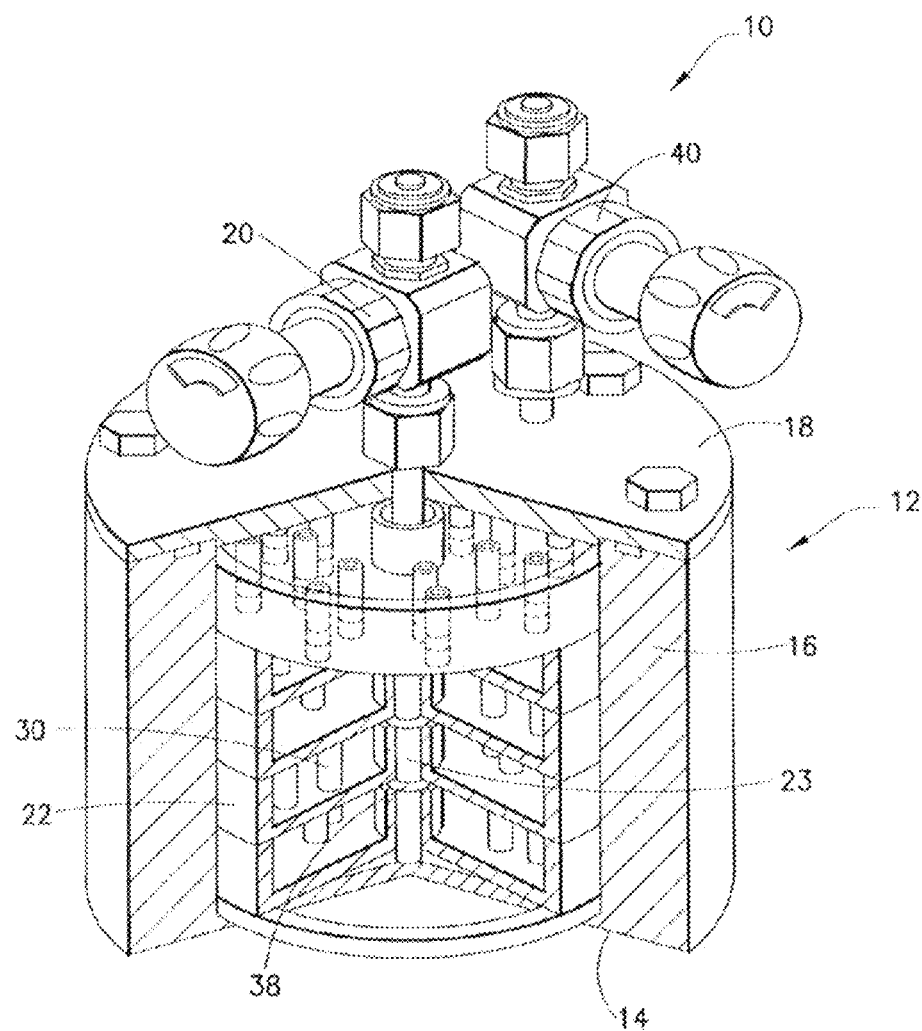
FIG. 1A illustrates a prior art vaporizer vessel including an outer shell body enclosing one or more support trays.

Referring to the Figures, FIG. 1A is perspective view of a prior art vaporizer 10 of a general type. The vaporizer 10 comprises a vessel body 12 fabricated of a suitable heat-conducting material. Vessel body 12 comprises a floor 14 and circumscribing sidewall 16 that together form an interior volume of the vessel. Vessel body 12 can have any shape that facilitates an even flow of carrier gas through the interior volume thereof. In one embodiment, the vessel has a cylindrical shape machined to very close tolerances (e.g., in a range of 1/1000th to 3/1000th of an inch (25.4 μm to 76.2 μm)). The vessel includes a lid 18 on which is mounted a carrier gas inlet valve 20 arranged to selectively introduce carrier gas into the interior volume of the vessel, when the valve is open, and a gas outlet valve 40 for dispensing of the vaporized material from the vaporizer vessel. Vaporizer vessel body 12 can be constructed from materials including stainless steel, graphite, silver, silver alloy, copper, copper alloy, aluminum, aluminum alloy, lead, nickel clad, silicon carbide coated graphite, pyrolytic carbon coated graphite, boron nitride, ceramic material, etc., as well as combinations, mixtures and alloys of two or more of such types of material.

Positioned in the internal volume of vessel body 12 is a plurality of vertically stacked support trays 22. The stacked support trays are separable from each other and removable from the vessel body for cleaning and refilling. Positioned within the vessel body is an internal central carrier gas downtube 23 that is connected (welded) to a gas inlet in the lid associated with inlet valve 20 and conveys the carrier gas to the bottom of the internal volume below the lowest tray in the array of vertically stacked trays. In FIG. 1A, central carrier gas downtube 23 passes through a cylindrical collar of each tray that extends through the floor of the tray. In this example, there is included at the cylindrical collar next to downtube 23 a sealing O-ring 38 positioned between successive trays to ensure a leak-proof seal at the juncture of the downtube with the floor of the tray. An additional outer O-ring can also be utilized to seal between trays on the top surface of each tray sidewall. Each of the individual trays 22 has a floor and sidewall to form a tray cavity for placement and support of the source material. The trays are preferably fabricated of a non-reactive heat-conducting material, such as for example stainless steel, silver, silver alloy, copper, copper alloy, aluminum, aluminum alloy, lead, nickel clad, graphite, pyrolytic carbon coated graphite, silicon carbide coated graphite, boron nitride, ceramic material, and combinations, mixtures and composites of two or more of the foregoing.

Referring again to FIG. 1A, the vertically stacked trays are provided with a plurality of protuberances or through-tubes 30 through which the carrier gas flows. The trays hold a solid precursor material for volatilization upon heating thereof. The heating may be carried out with thermal energy being inputted to the vessel body to conductively heat the trays mounted in the vessel body so that the precursor material disposed in the trays is heated sufficiently to volatilize the precursor material. The volatilized precursor then is entrained in the carrier gas flowed through the interior volume of the vaporizer vessel and carried out of the vessel body via outlet 40 in such carrier gas in the dispensing operation. Additionally, or alternatively, to the heating of vaporizer vessel 10 with thermal energy input, the carrier gas itself may be heated to an appropriate temperature to effect or assist in the volatilization of the precursor material within the trays when the carrier gas is contacted with the precursor material.

Figures 1B, 1C:
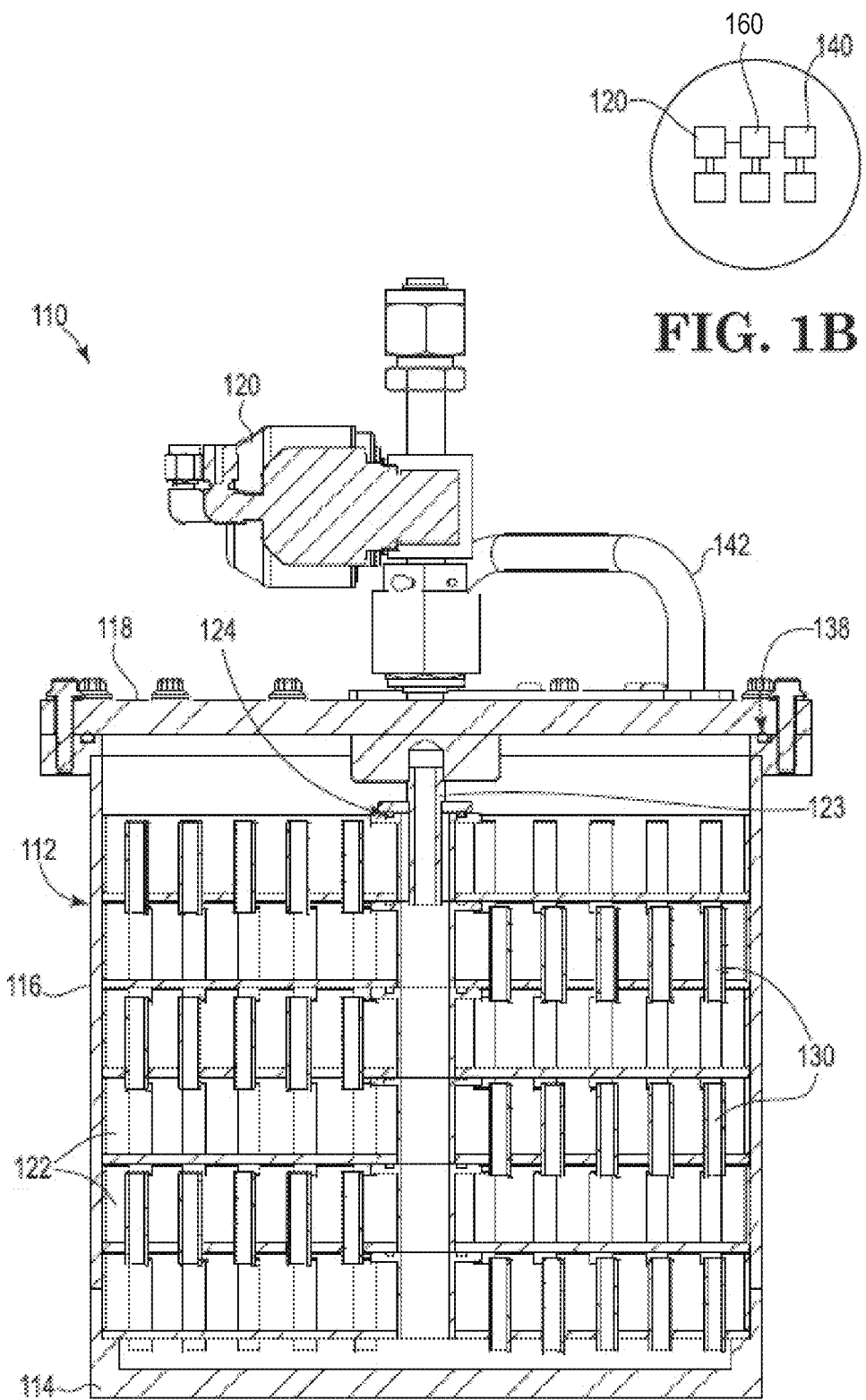
FIGS. 1B and 1C illustrate a top view and a side cutaway view of an embodiment of a vaporizer vessel enclosing one or more support trays.

FIGS. 1B and 1C illustrate a side cutaway view and a top view of another embodiment of a vaporizer vessel 110 enclosing one or more support trays 122. The vaporizer 110 comprises a vessel body 112 fabricated of a suitable heat-conducting material. Vessel body 112 comprises a floor 114 and circumscribing sidewall 116 that together form an interior volume of the vessel. Vessel body 112 can have any shape that facilitates an even flow of carrier gas through the interior volume thereof. In one embodiment, the vessel has a cylindrical shape machined to very close tolerances (e.g., in a range of 1/1000th to 3/1000th of an inch (25.4 μm to 76.2 μm). The vessel includes a lid 118 that fits over vessel body 112 and includes an interposing O-ring 138 to improve the seal between lid 118 and body 112. Lid 118 includes mounted thereon a carrier gas inlet valve 120 arranged to selectively introduce carrier gas into the interior volume of the vessel, when the valve is open, and a gas outlet valve 140 for dispensing of the vaporized material from the vaporizer vessel and a bypass valve 160 for use of purging connections dry after installation and removing residual chemistry to remove the container after use. The bypass valve could also be used to cycle carrier gas flow between the container during deposition and the bypass between wafers or pulses. Vaporizer vessel body 112 can be constructed from materials similar to vessel body 12 described above.

Positioned in the internal volume of vessel body 112 is a plurality of vertically stacked support trays 122. The stacked support trays are separable from each other and removable from the vessel body for cleaning and refilling. Positioned within the vessel body is an internal central carrier gas downtube 123 that is connected (welded) to a gas inlet in the lid associated with inlet valve 120 and conveys the carrier gas to the bottom of the internal volume below the lowest tray in the array of vertically stacked trays and the gas with the precursor material comes up through the vent tubes and exits tube 142 and exits through outlet 140. In FIG. 1C, central carrier gas downtube 123 passes through a cylindrical collar of each tray that extends through the floor of the tray. In this example, there is included at the cylindrical collar next to downtube 123 a cylindrical color or sealing O-ring 124 positioned between successive trays to ensure a leak-proof seal at the juncture of the downtube with the floor of the tray. Alternatively, the O-ring would seal between the carrier gas down tube and the first tray only and the successive trays below are adequately sealed without an O-ring. An additional outer O-ring 138 is utilized to seal between the body or base flange and the lid 118. Each of the individual trays 122 has a floor and sidewall to form a tray cavity for placement and support of the source material. The trays are preferably fabricated of a non-reactive heat-conducting material, such as for example stainless steel, silver, silver alloy, copper, copper alloy, aluminum, aluminum alloy, lead, nickel clad, graphite, pyrolytic carbon coated graphite silicon carbide coated graphite, boron nitride, ceramic material, and combinations, mixtures and composites of two or more of the foregoing.

Referring again to FIGS. 1B and 1C, the vertically stacked trays are provided with a plurality of protuberances or through-tubes 130 through which the carrier gas flows. The trays hold a solid precursor material for volatilization upon heating thereof. The heating may be carried out with thermal energy being inputted to the vessel body to conductively heat the trays mounted in the vessel body so that the precursor material disposed in the trays is heated sufficiently to volatilize the precursor material. The volatilized precursor then is entrained in the carrier gas flowed through the interior volume of the vaporizer vessel and carried out of the vessel body via outlet 40 in such carrier gas in the dispensing operation. Additionally, or alternatively, to the heating of vaporizer vessel 110 with thermal energy input, the carrier gas itself may be heated to an appropriate temperature to effect or assist in the volatilization of the precursor material within the trays when the carrier gas is contacted with the precursor material.

Even with the various configurations offered in the prior art to facilitate even and continuous sublimation of precursor materials for semiconductor processing, semiconductor component manufacturers are facing the challenges of increasing semiconductor component processing throughput and improving semiconductor component yields while dealing with rapidly changing semiconductor component designs requiring more manufacturing efficiency. These challenges dictate the need for both increased delivery rates and improved consistency of delivery for the lifetime of the ampoule. Thus the need for even, uniform temperature profiles throughout the ampoule in the face of increasing heat loads needed for higher vaporization rates. One area that can improve the overall installed base of semiconductor processing is providing improved efficiencies in precursor material sublimation with current vaporizer vessel designs that can be implemented in current installations to address some of these manufacturing, energy consumption and precursor sublimation efficiency challenges. Providing a retrofitable thermal transfer enhancing assembly or configurable vaporizer component for use with a vaporizer vessel that can be readily used onsite would be a substantial advantage to the semiconductor manufacturer and advancement in the prior art.

Referring now to one or more of the various embodiments of the invention that solve thermal conduction and heat transfer challenges between vaporizer vessel bodies and support trays for the semiconductor manufacturer, there are provided either an add-on component for immediate use with current vaporizer assemblies or a unique support tray structure or configuration that can be retrofitted into current standard vaporizer vessels found in current installations.

Figure 2A:
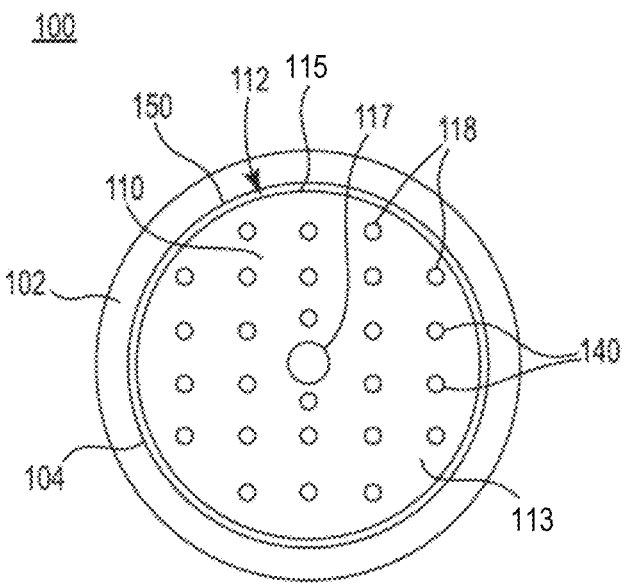
FIGS. 2A and 2B illustrate a top view and a cutaway view of a vaporizer vessel including at least one support tray and a thermally conductive assembly (mesh or foam) disposed between an outside surface of a support tray sidewall and an interior surface of a vessel body or base according to an example embodiment of the invention.
Figure 2B:
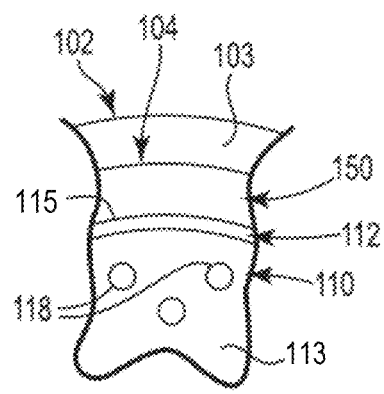

Referring now to FIGS. 2A and 2B, there is illustrated a top view and a cutaway view, respectively, of a vaporizer or ampoule 100 having a vessel body 102 that includes at least one support tray 110 disposed therein and a thermally conductive member or assembly 150 that is located there between to improve heat conduction between vessel body 102 and tray 110 according to an example embodiment of the invention. In particular, thermally conductive member 150 is located between an outside surface 115 of a support tray sidewall 112 and an interior surface 104 of vessel body or base 102. In this example embodiment, vapor delivery vessel assembly 100 for vaporizing and delivering vaporized source material includes vessel body 102 having an interior volume defined by a base (not shown) and a sidewall 103, sidewall 103 defining an interior diameter of the vessel body and having an interior sidewall surface 104. Vapor delivery assembly 100, although not shown in FIG. 2A (see FIG. 1, for example), includes a gas inlet and a gas outlet arranged in fluid communication with the interior volume of vessel body 102, the gas inlet being adapted to supply a first gas to the interior volume of the vessel. Assembly 100 includes vented support tray 110 disposed within the interior volume and adjacent sidewall 103 of vessel body 102, with support tray 110 configured to support a vaporizable source material in the flow path extending between the gas inlet and the gas outlet. Finally, assembly 100 includes heat transfer enhancing member 150 located between vessel sidewall 103 and vented support tray 110, heat transfer enhancing member or assembly 150 (or thermally conductive member) acting to reduce any air gaps between vessel body sidewall 103 and support tray 110. In a related embodiment, a plurality of support trays each would include a heat transfer enhancing member located about the tray.

In this example embodiment, thermally conductive member 150 improves heat transfer as it comprises a heat conductive, compressible mesh or foam liner that is placed between support tray 110 and vessel body or base wall 104. The mesh or foam liner 150 allows for more of a gap between tray 110 and an inner diameter or vessel wall 104 so to reduce undesirable support tray sticking but would still improve the heat transfer from the vessel wall to the support trays. In various embodiments, mesh or foam liner 150 is installed on the entire diameter of support tray 110 or alternatively only on one side (or a portion of) of tray 110 to shim (or shift) one side of the tray towards or up against vessel wall 104 to enhance physical contact and improve heat conduction from vessel wall 104 to tray 110 while still allowing for good heat conduction to the side that is removed from the wall.

In a related example embodiment, mesh liner 150 is combined as an assembly with a reservoir of low vapor pressure inert oil or low melting grease in a bottom plenum or well of the ampoule base or vessel base 104 that mesh or foam liner 150 protrudes into. At operating temperatures, the oil or grease is absorbed by, or will wick up into, the mesh (or conductive mesh or foam) by capillary action, filling more of the void space with a thermally conductive media, thus allowing for improved heat transfer to tray 110 from vessel wall 104.

In this example embodiment, support tray 110 includes a floor panel 113 that supports the precursor material and includes a plurality of holes 118 to facilitate the carrier gas to flow up through the various tray modules in the ampoule. In a related embodiment, elongate slots are used instead of holes. Tray 110 also includes a central opening 117 for channeling the carrier gas through one or more support tray 110 in an assembled ampoule 100. In a related embodiment, the vessel body and trays use a central or main gas flow structure other than a central opening, such as along and down through a perimeter of the support trays and vessel body. In this example embodiment, support tray 110 further includes a plurality of through-tubes 140 providing a passageway for movement of the carrier gas through each through-tube 140. The through-tubes in various embodiments extend upwardly from floor 113 of the support tray and define a central passageway communicating with a corresponding opening or hole 118 in tray floor 113. In other embodiments, through-tubes 140 extend upwardly from floor 113 of the tray in the same manner, but also extend downwardly below tray 110, so that the central passageway is enclosed by the through-tube, e.g., as a central bore thereof, both above and below the floor of the tray. The through-tubes can have any shape or configuration that provides for flow of gas therethrough such as being cylindrical or conical in shape.

Figure 3:
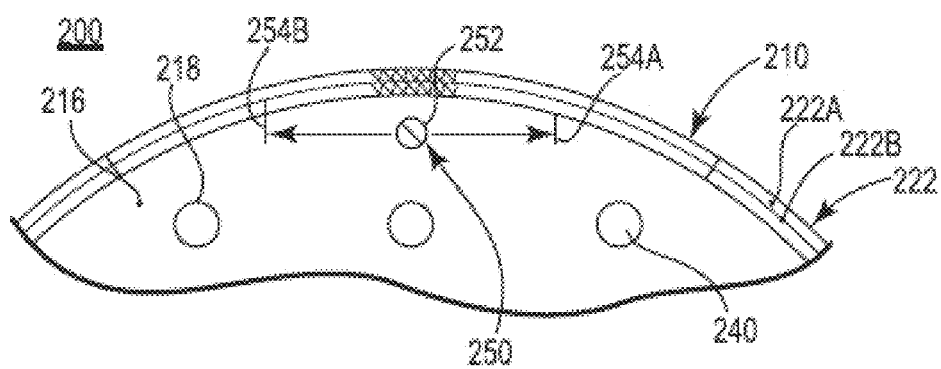
FIG. 3 illustrates a top view of a portion of a support tray that is expandable, using a tool or a screw mechanism, to increase the diameter of the support tray thereby increasing the support tray's physical contact with an interior surface of a vessel body or base according to an example embodiment of the invention

Referring now to FIG. 3, there is provided a top view of a portion of a support tray assembly 200 which includes a support tray 210 that is designed to be expandable, using a tool or a screw mechanism 250, to increase the diameter of the support tray thereby increasing the support tray's physical contact with an interior surface of a vessel body or base according to an example embodiment of the invention. Heat transfer could be improved by modification of the tray design to allow for compression of the outer wall to the inner surface of the vessel body. As part of tray assembly 200, support tray 210 includes a sidewall 222, partially comprised of two laterally sliding sidewall members 222A and 222B, and screw mechanism 250 that includes a screw 252 and two lateral members 254A and 254B that move sidewall members 222A and 222B laterally. Lateral member 254B is connected to sidewall member 222A (outer expandable ring of the assembly) while member 254A is connected to sidewall member 222B. Upon turning screw 252 in one direction two lateral members 254A and 254B move sidewall members 222A and 222B so that they slide laterally outwardly to expand sidewall 222 away from base plate 216 or they slide laterally inwardly towards base plate 216 to contract sidewall 222 upon turning screw mechanism 250 in the other direction. In various example embodiments, tray assembly 200 has expandable sidewall sections (one or more expandable sections) that would allow each tray to quickly be secured and pushed against the sidewall of the vessel body. In one example embodiment, there could be an overlapping sidewall section of the tray, comprised of sidewall members 222A and 222B, which is not welded to bottom 216 of tray 210 but is in contact with bottom 216. In one example embodiment, tray 210 has teeth to force open and lock using a pliers or a screw mechanism that could be welded to each of the inner 222B and outer sections 222A of the wall and force the walls open causing them to expand. Tray sidewall 222 could be secured to tray bottom 216 after expansion.

Figure 4:
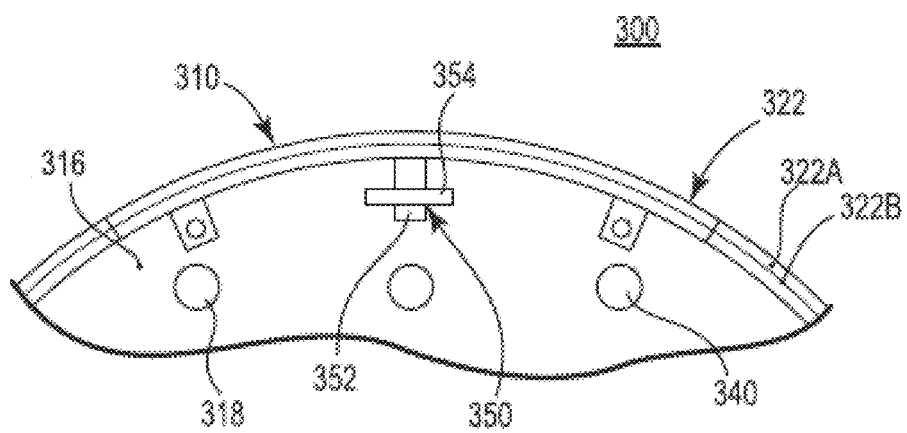
FIG. 4 illustrates a top view of a portion of a support tray that is expandable using a set screw mechanisms to increase the diameter of the support tray thereby increasing the support tray's physical contact with an interior surface of a vessel body according to an example embodiment of the invention.

Referring now to FIG. 4, there is illustrated a top view of a portion of a support tray assembly 300 includes a heat transfer enhancing member comprised of an expandable support tray sidewall system using a set screw mechanism or assembly 350 to increase a diameter of support tray 310 thereby increasing the support tray's physical contact with an interior surface of a vessel body according to an example embodiment of the invention. As part of tray assembly 300, support tray 310 includes a sidewall 322, partially comprised of two laterally sliding sidewall members 322A and 322B, and screw mechanism 350 that includes a screw 352 and lateral moving member 354 moves both sidewall members 322A and 322B laterally. Upon turning screw 352 in one direction sidewall members 322A and 322B move such that they slide laterally outwardly to expand sidewall 322 away from base plate 316 or they slide laterally inwardly towards base plate 316 to contact sidewall 322 upon turning screw mechanism 350 in the other direction. The screw mechanism further adapted to maintain the circumferential sidewall assembly in an expanded configuration. In various example embodiments, tray assembly 300 has expandable sidewall sections (one or more expandable sections) that would allow each tray to quickly be secured and pushed against the sidewall of the vessel body. In one example embodiment, there are overlapping sidewall sections of the tray, comprised of sidewall members 322A and 322B, which is not welded to bottom 316 of tray 310 but is in contact with bottom 316. In one example embodiment, tray 310 has teeth to force open and lock using a pliers or a screw mechanism that could be welded to each of the inner 322B and outer sections 322A of the wall and force the walls open causing them to expand. Tray sidewall 322 could be secured to tray bottom 316 after expansion. In another example embodiment, another concept of the partial expanding wall section is to expand the split section using an internal anchor (welded to bottom of the tray) and a screw to push out the section so it contacts the internal diameter of the vessel body. Once expanded, the section could be secured to the bottom of the tray if needed for thermal contact. In yet another related embodiment, the tray is larger than the current tray and has a compressible sidewall (with optional release) that can expand after installation into the base or vessel body.

In other related embodiments, support tray assemblies 200 and 300 have an outer diameter of their sidewall assemblies that includes a groove or channel configured to receive a C-ring member that is compressed upon insertion of the support tray within the vessel body interior volume and which shifts the support tray within the interior vessel volume to increase the surface area physical contact between the support tray and the interior sidewall surface of the vessel body. The C-ring is compressed to install the tray and released once the tray is in place. The compression could be done while the tray is being filled externally and must be locked in the compressed position. A release mechanism could be pressed or a threaded set screw backed out to release the C-ring so it could contact the vessel body internal wall. The C-ring would also significantly reduce any carrier gas from flowing between the tray and the vessel body. In one example embodiment, the C-ring member is made of a heat conductive material to enhance heat transfer between the support tray sidewall assembly and the interior sidewall of the vessel body.

Another example embodiment for improving heat transfer between the vessel body and each support tray located within the vessel body of a vaporizer eliminates or significantly reduces a tray sidewall height and instead a user fills the support tray in place within the vessel body. In this example embodiment, the precursor chemicals are located directly against the inner wall or internal diameter of the vessel body. In one example embodiment, the in-situ fill and the precursor material's subsequent exposure to or contact with the carrier gas and improved flux rate is a significant improvement alone or in conjunction with the improved contact with the vessel wall. In a related example embodiment, a three-legged support spacer attached to the tray surface would extend upward from the tray surface to provide the proper spacing between each of the support trays. In this example embodiment, the transfer assembly includes at least 3 non-perimeter support legs or posts (could be located elsewhere on the support tray to form the tripod support intended) each of which are disposed on the first surface of the first support tray. In a related example embodiment, the heat transfer assembly includes a plurality of vent tubes sealed at an upper end and disposed on the first surface of the first support tray, the vent tubes including at least one of a plurality of holes on the vent tube sidewalls.

In another example embodiment, a vented metal disk bottom plate is added to form part of a two-piece support tray assembly. In this example embodiment, the bottom plate of the support tray includes one or more vent tubes and a center tube (but not necessarily limited to the center location) for gas transfer passage that is fabricated as a single piece. The outer diameter of the bottom plate of the tray is reduced to account for tolerance issues in fabrication and to ensure that it will be easily inserted into the vessel body. In this example embodiment, the outer wall of the tray would be effectively a spacer member that separates the successive bottom plates as they are stacked into the vessel body and filled in place. The advantage to this approach would allow for the fabrication of spacer member (i.e., the outer wall of the two piece tray) from tubing that was closely matched in tolerance to the internal diameter of the vessel body. Such a configuration would allow good heat transfer from the vessel body to the spacer, which is in physical contact with the bottom plate of the support tray, allowing for the subsequent transfer of heat from the spacer to the bottom plate of the support tray. In a related embodiment, a separate spacer or heat transfer platform is added to the radial edge of the support tray that is disposed on and extends up and downwards, with no sidewall to support the tray above, after the tray bottom is installed in the ampoule or vaporizer. In yet another related embodiment, the spacer member only extends upwardly on the radial edge of the support tray but has no actual sidewall to support the tray above the base portion of the ampoule or vaporizer.

In various related embodiments, a vented metal disk bottom plate substitutes the support tray such that vented metal disk bottom plate assemblies have heat transfer improvements similar to the support tray. These improvements include, but are not limited to: expanding outer surface or ring that contacts the sidewalls of the base while holding the disk in a grove or ledge; C-ring concept, compressed outer surface that is compressed before installed and release when in place; the conductive mesh or liner; and the conductive oil/grease with our without a foam or conductive mesh. In related embodiments, the expanding outer surface or ring could be the same thickness as the disk or it could be larger to contact more of the sidewall of the base. The disk could be secured to the expanding disk after expansion or release to improve heat transfer.

Referring again to FIGS. 2-4, in various example embodiments, through-tubes 140, 240 and 340 can be secured to the floor of the tray in any suitable matter, e.g., by welding, brazing, mechanical fastener attachment, press-fit, swaging, etc. In the alternative, the through-tubes can be integrally formed as part of the tray floor. In a specific embodiment, the height of each of the through-tubes is approximately the same height as that of the tray sidewall, although other embodiments are contemplated, in which the height of each of the through-tubes is greater or less than such sidewall. The side walls of the respective trays may be of sufficient height, so that the trays are stackable to form a vertically extending stacked array in the interior volume of the vessel of the vaporizer. In another embodiment, the trays may be fabricated with sidewalls that are only of sufficient dimensional extent as to allow mounting or fixation to the interior wall surface of the vaporizer vessel.

The various support tray assemblies described herein can be subjected to standard vaporizer temperatures applied to standard vaporizer assemblies that are utilized in a given application, depending on the operating conditions of the downstream fluid-utilizing apparatus, e.g., CVD apparatus or ion implantation system, and the vapor pressure and the amount of the source material that is provided. In various specific embodiments in which sublimable solid source reagents are utilized, vaporizer temperatures in a range of from about 20° C. to about 300° C. can be utilized (current applications may be limited by the availability of high purity valves that go above 300° C.). Implementations of the present invention involving metal halide solid source reagents can for example utilize temperatures in a range of from about 100° C. to about 200° C., in specific embodiments. The source reagent material may be in any suitable form, including solid form, liquid form, semi-solid form, or a solution containing the source reagent material dissolved or dispersed in a suitable solvent medium. For additional chemistries for sublimation, tray module configurations, gas flows and ampoule assembly configurations, reference is made to U.S. Pat. No. 8, 821,640 to Cleary et al., and to WO 2015/164029 to Baum et al., published on Oct. 29, 2015 and entitled SOLID VAPORIZER which is incorporated by reference in its entirety.

Various embodiments of the invention have been described above for purposes of illustrating the details thereof and to enable one of ordinary skill in the art to make and use the invention. The details and features of the disclosed embodiment[s] are not intended to be limiting, as many variations and modifications will be readily apparent to those of skill in the art. Accordingly, the scope of the present disclosure is intended to be interpreted broadly and to include all variations and modifications coming within the scope and spirit of the appended claims and their legal equivalents.

We claim:

1. A vapor delivery vessel assembly for vaporizing and delivering vaporized source material, the vessel assembly comprising:

a vessel body having an interior volume defined by a base and a sidewall, the sidewall defining an interior diameter of the vessel and having an interior sidewall surface;

a gas inlet and a gas outlet arranged in fluid communication with the interior volume, the gas inlet being adapted to supply a first gas to the interior volume of the vessel;

a vented support tray disposed within the interior volume and adjacent the sidewall of the vessel body, the support tray adapted to support a vaporizable source material in the flow path extending between the gas inlet and the gas outlet; and a heat transfer enhancing member located between the vessel sidewall and the vented support tray, the heat transfer enhancing member adapted to reduce any air gaps between the vessel body sidewall and the support tray, wherein the heat transfer enhancing member includes a heat conductive mesh liner adapted to be located between and in contact with the vessel body sidewall and the support tray;

the heat transfer enhancing member includes a heat conductive oil or grease material adapted to be located between and in contact with the vessel body sidewall and an edge or sidewall of the support tray; or the heat transfer enhancing member includes a circumferential sidewall assembly that extends upwards from and is in contact with the support tray, the sidewall assembly adapted to expand radially out towards the sidewall of the vessel body to increase surface area physical contact between the support tray and the interior sidewall surface of the vessel body.

2. The vapor delivery vessel assembly of claim 1, wherein the heat conductive mesh liner is located to be partially about the support tray and is adapted to laterally shift the support tray within the interior volume to increase surface area physical contact between an edge or sidewall of the support tray and the interior sidewall surface of the vessel body.

3. The vapor delivery vessel assembly of claim 1, wherein the heat transfer enhancing member further includes a foam or mesh liner member adapted to absorb the heat conductive oil or grease material, the foam or mesh liner member adapted to be disposed partially or totally about the support tray.

4. The vapor delivery vessel assembly of claim 1, wherein the sidewall assembly includes a section that is partially expandable radially out towards the sidewall of the vessel body to shift the support tray within the interior vessel volume to increase surface area physical contact between the support tray and the interior sidewall surface of the vessel body.

5. The vapor delivery vessel assembly of claim 1, wherein an outer diameter of the sidewall assembly includes a groove or channel adapted to receive a C-ring member, the C-ring member adapted to be compressed upon insertion of the support tray within the vessel body interior volume and adapted to shift the support tray within the interior vessel volume to increase surface area physical contact between the support tray and the interior sidewall surface of the vessel body.

6. The vapor delivery vessel of claim 5, wherein the C-ring member is made of a heat conductive material to enhance heat transfer between the support tray sidewall assembly and the interior sidewall of the vessel body.

7. The vapor delivery vessel of claim 1 wherein the circumferential sidewall assembly is outwardly expandable with a screw mechanism adapted to direct an outward force to the circumferential sidewall assembly to increase surface area contact with the vessel body interior sidewall, the screw mechanism further adapted to maintain the circumferential sidewall assembly in an expanded configuration.

8. A vapor delivery vessel assembly for vaporizing and delivering vaporized source material, the vessel assembly comprising:

a vessel body having an interior volume defined by a base and a sidewall, the sidewall defining an interior diameter of the vessel body and having an interior sidewall surface;

a gas inlet and a gas outlet arranged in fluid communication with the interior volume of the vessel body, the gas inlet being adapted to supply a first gas to the interior volume of the vessel body;

a first vented support tray disposed within the interior volume and adjacent the sidewall or interior wall of the vessel body, the support tray adapted to support on a first surface a vaporizable source material in the flow path extending between the gas inlet and the gas outlet; and a heat transfer assembly disposed on the first support tray and located between the vessel body sidewall and the first support tray, the heat transfer assembly supported at least partially by the first surface of the support tray within the interior volume of the vessel body wherein the heat transfer assembly includes a circumferential sidewall assembly that extends upwards from and is in contact with the support tray, the sidewall assembly adapted to expand radially out towards the sidewall of the vessel body to increase surface area physical contact between the support tray and the interior sidewall surface of the vessel body; or the heat transfer assembly includes a sidewall assembly that includes a section that is partially expandable radially out towards the sidewall of the vessel body to shift the support tray within the interior vessel volume to increase surface area physical contact between the support tray and the interior sidewall surface of the vessel body.

9. The vapor delivery vessel assembly of claim 8, further comprising a heat transfer assembly disposed between the vessel sidewall and the first support tray supported at least partially by the first surface of the support tray within the interior volume of the vessel, the heat transfer assembly further adapted to support a second support tray within the vessel.

10. The vapor delivery vessel of claim 8, wherein the circumferential sidewall assembly is outwardly expandable with a screw mechanism adapted to direct an outward force to the circumferential sidewall assembly to increase surface area contact with the vessel body interior sidewall, the screw mechanism further adapted to maintain the sidewall assembly in an expanded configuration.

11. The vapor delivery vessel assembly of claim 8, wherein the sidewall assembly of the support tray is compressible and the sidewall assembly includes a release, the support tray sidewall extending radially out towards the vessel body sidewall to increase surface area physical contact between the support tray and/or the vaporizable material and the interior sidewall surface of the vessel body, the release actuatable for removing compressed support tray from the vessel body.

\* \* \* \* \*